(12) United States Patent
Manepalli et al.

(10) Patent No.: US 11,508,676 B2
(45) Date of Patent: Nov. 22, 2022

(54) DENSITY-GRADED ADHESION LAYER FOR CONDUCTORS

(71) Applicant: Intel Corporation, Santa Clara, CA (US)

(72) Inventors: Rahul N. Manepalli, Chandler, AZ (US); Kemal Aygun, Tempe, AZ (US); Srinivas V. Pietambaram, Chandler, AZ (US); Cemil S. Geyik, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 677 days.

(21) Appl. No.: 16/412,464

(22) Filed: May 15, 2019

(65) Prior Publication Data
US 2020/0365533 A1    Nov. 19, 2020

(51) Int. Cl.
| | | |
|---|---|---|
| H01L 23/66 | (2006.01) | |
| H01L 23/522 | (2006.01) | |
| H01L 23/532 | (2006.01) | |
| H01L 23/528 | (2006.01) | |

(52) U.S. Cl.
CPC .......... *H01L 23/66* (2013.01); *H01L 23/5226* (2013.01); *H01L 23/5283* (2013.01); *H01L 23/53233* (2013.01); *H01L 23/53238* (2013.01); *H01L 2223/6616* (2013.01)

(58) Field of Classification Search
CPC . H01L 23/66; H01L 23/5226; H01L 23/5283; H01L 23/53233; H01L 23/53238; H01L 2223/6616; H01L 21/76834; H01L 23/53295; H01P 3/003
See application file for complete search history.

(56) References Cited

U.S. PATENT DOCUMENTS

2015/0200042 A1*  7/2015  Ling ................ H01B 19/04
                                                                 216/13

OTHER PUBLICATIONS

Friedlein, et al., Bias-controlled, high-rate plasma deposition of dense and transparent silicon nitride films at substrate temperatures below 100° C., Proc. International Conference on Coatings on Glass and Plastics 12, Thin Solid Films, 2018. 5 pages.

* cited by examiner

*Primary Examiner* — Jonathan Han
(74) *Attorney, Agent, or Firm* — Schwabe, Williamson & Wyatt, P.C.

(57) ABSTRACT

Density-graded adhesion layers on conductive structures within a microelectronic package substrate are described. An example is a density-graded adhesion layer that includes a dense region proximate to a conductive structure that is surrounded by a less dense (or porous) region adjacent to an overlying dielectric layer. Providing such a graded adhesion layer can have a number of benefits, which can include providing both mechanical connections for improved adhesion with a surrounding dielectric layer and provide hermetic protection for the underlying conductive structure from corrosive species. The adhesion layer enables the conductive structure to maintain its as-formed smooth surface which in turn reduces insertion loss of signals transmitted through the conductive structure.

20 Claims, 5 Drawing Sheets

DENSITY-GRADED ADHESION LAYER FOR CONDUCTORS

BACKGROUND

For transmission line structures, power loss during transmission of an electrical signal can be due to (i) conductor loss and/or (ii) dielectric loss. Conductor loss is due in part to the bulk conductivity of the material used for the conductive structure. Another contribution to conductor loss is the surface roughness of the conductive structure itself. Surface roughness can be important in high frequency applications because electrical current can preferentially travel on the surface of a conductive structure at high frequencies. Conductive structures having more surface roughness thus have a higher effective resistivity and correspondingly higher signal loss.

Figures 1A, 1B:
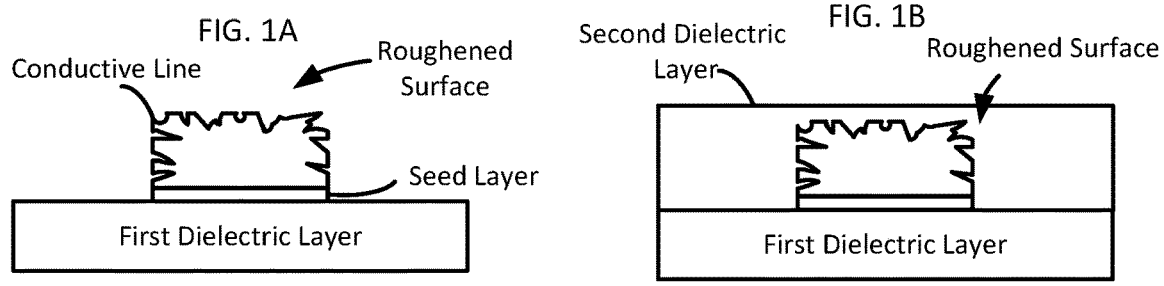
FIGS. 1A and 1B are cross-sectional views of a microelectronic package substrate (taken perpendicular to a plane of the substrate) that include a conductive structure, in which surfaces of the conductive structure are roughened to improve adhesion with a surrounding dielectric layer.

The figures depict various embodiments of the present disclosure for purposes of illustration only. Numerous variations, configurations, and other embodiments will be apparent from the following detailed discussion. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Density-graded adhesion layers for microelectronic packages are disclosed, wherein the adhesion layer has a dense region and a porous/less dense region. Although the adhesion layers can be used in any number of applications, they are particularly well-suited for being provisioned around (and in some cases on) conductive structures, such as transmission lines vias, and other conductive pathways on which travel high frequency signals, in. The conductive structures can be formed in a relatively narrow trench (e.g., conductive line) or hole (e.g., conductive via). In one example embodiment, a density-graded adhesion layer (e.g., silicon nitride ($SiN_x$)) includes a dense region proximate to a conductive structure. A less dense (or porous) region of the adhesion layer is adjacent to an overlying dielectric layer (such that the lower density region is between the relatively denser region and the overlying dielectric layer). This density-graded layer of adhesion (or other suitable adhesion-improving material) can not only provide mechanical connections for improved adhesion with a surrounding dielectric layer, but can also provide hermetic protection for the underlying conductive structure, according to some embodiments. That is, the less dense/porous portion that is proximate to a surrounding dielectric layer will provide pores/channels for mechanical connection with the dielectric layer, which can improve adhesion, and the more dense region that is proximate to an adjacent conductive structure can hermetically protect the conductive structure from, for example, water vapor, oxygen, and other reactive species. Because the adhesion layer is not used to conduct a signal, the presence of a less dense portion does not cause skin effect insertion loss with respect to the signal being carried in a signal carrying conductor material (e.g., copper, aluminum, tungsten). Instead, the adhesion layer enables the conductive structure to maintain its as-formed smooth surface which in turn reduces the resistance of the conductive structure and accordingly further reduces insertion loss of signals transmitted through the conductive structure, due to reduced impedance mismatch.

General Overview

Microelectronic package substrates generally include conductive structures that are surrounded by dielectric material. In some cases, signals transmitted through the conductive structures can be degraded through one or more loss mechanisms, one of which can be a function of the surface roughness of the conductor. This is particularly true of high frequency signals, such as radio frequency (RF) and microwave signals. In the context of a high frequency transmission line, this increased resistivity can cause an impedance mismatch with respect to the impedance of the source of the input signal being applied to the transmission line. Such an impedance mismatch can cause input signal loss (sometimes referred to as insertion loss). This effect increases with increasing signal frequency, thus impacting the performance of electronic devices such as mobile communication devices that transmit and receive at high frequencies (e.g., from the 500 megahertz range to one or more gigahertz range).

Reducing surface roughness of conductive structures in packages can reduce the electrical resistance of the conductors and thus improve performance of the device as a whole, particularly at high frequencies. However, despite the adverse effect of surface roughness, sometimes conductive structures are intentionally exposed to an appropriately composed etchant that can create the relatively jagged, irregular surface topography indicated in FIG. 1A. The surface roughness on the conductive structure in turn improves adhesion with a surrounding dielectric layer by providing mechanical anchors and connection points therebetween. This is illustrated in FIG. 1B. Thus, there are conflicting interests with respect to surface roughness. Organic adhesion promoters can be applied to smooth conductive structures so as to encourage adhesion between the smooth conductive structures and dielectric layers, so as to avoid etching and the intentional formation of surface roughness. However, these adhesion promoters generally do not produce adhesion comparable to surface-roughened conductive structures.

Thus, techniques are described for the formation of a density-graded adhesion layer on and/or over a corresponding conductive structure in a microelectronic package. The density-graded adhesion layer can be, for example, a $SiN_x$ layer having dense and porous portions, although any number of other suitable adhesion-promoting materials can be used. In any such cases, the adhesion layer can be formed on and/or over one or more of vias and/or conductive lines (also known as traces). In an embodiment, the graded adhesion layers include a dense region proximate to the copper trace and a less dense (or porous) region proximate to a surface of an adjacent dielectric layer. This density-graded adhesion layer provides mechanical connections for improved adhesion with a surrounding dielectric layer, but at a surface that does not conduct signals. That is, the less dense/porous films proximate to the laminated dielectric will provide pores/channels for mechanical connection with the dielectric layer, which improves adhesion between the adhesion-coated conductive structure and a surrounding dielectric layer. The dense region of the graded adhesion layer that is proximate to the copper trace can provide good hermeticity. The smooth, as-formed surface of the conductive structure is thus preserved thereby reducing insertion loss due to the skin effect and the related increased conductor resistance. In this way, improved adhesion and signal integrity do not negatively influence one another.

Note that trench and hole may be used herein interchangeably. To this end, note that a trench may be elongated, such as for a transmission line or lengthy conductive run or trace, or hole-like for a via. Thus, trench is intended to cover any number of conductive structures.

Materials that are "compositionally different" or "compositionally distinct" as used herein refers to two materials that have different chemical compositions. This compositional difference may be, for instance, by virtue of an element that is in one material but not the other (e.g., SiGe is compositionally different from silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

In addition, some layers or materials provided herein are in the form of compounds, such as silicon nitride ($Si_yN_x$) adhesion layer. Other example adhesion layer compositions include, in various embodiments, oxides, carbides, oxycarbides, and oxynitrides of titanium, tantalum, and silicon. Examples include oxides, carbides, oxynitrides, and oxycarbides of titanium, tantalum, and silicon, silicon carbide, silicon oxynitride, and silicon oxycarbide. Note that the stoichiometry of such compounds may vary from one embodiment to the next, and such compounds represented without specific stoichiometric coefficients or values are intended to represent all forms of that compound, as will be appreciated.

Example Structure

Figure 1C:
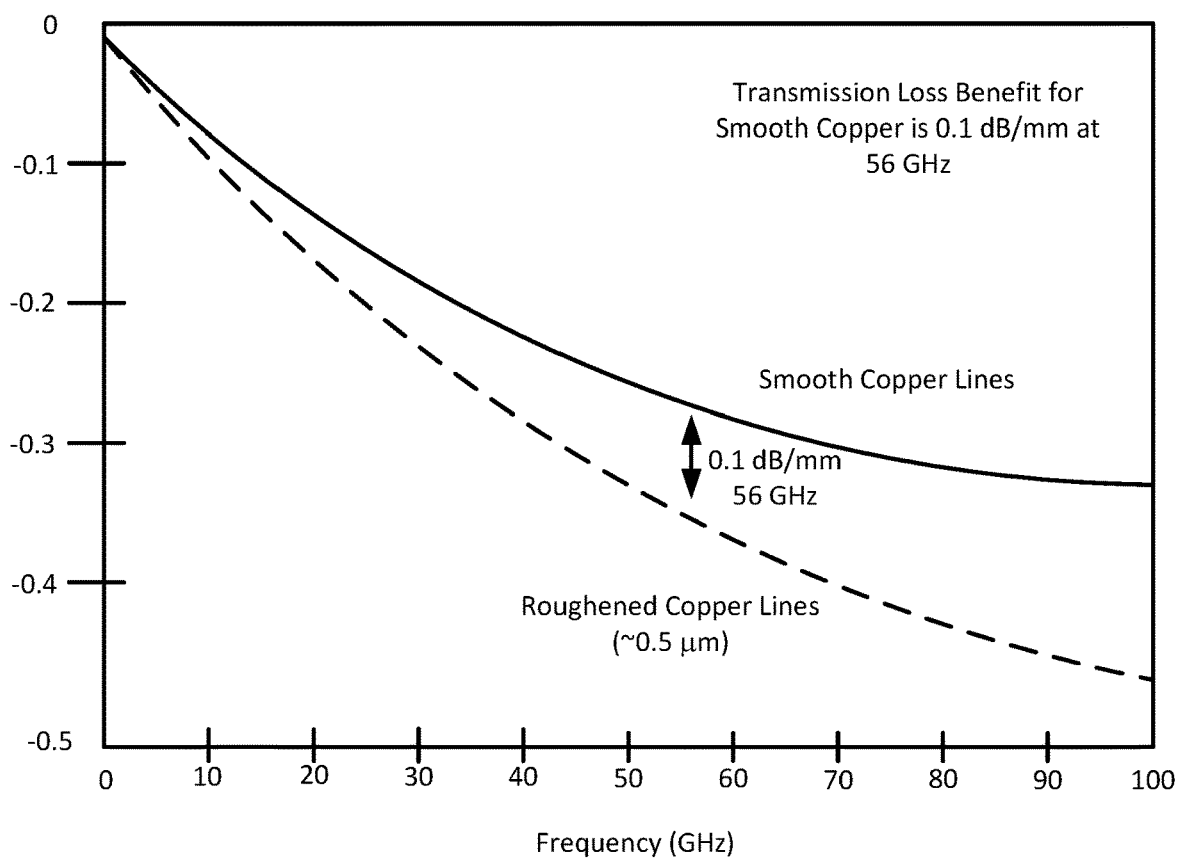
FIG. 1C illustrates plots of simulated insertion losses over a range of frequencies of a signal transmitted through a copper transmission line having a smooth surface compared to insertion loss of a signal transmitted through a copper trace having a roughened surface, in accordance with an embodiment of the present disclosure.
Figure 2:
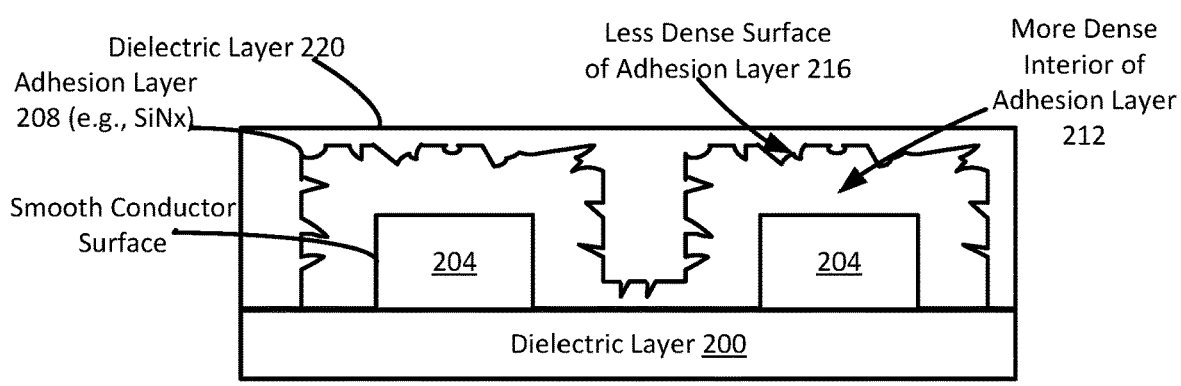
FIG. 2 is a cross-sectional view of a microelectronic package substrate (taken perpendicular to a plane of the substrate) that includes conductive structures having a smooth surface covered on three sides with an adhesion layer, wherein the adhesion layer has a dense region proximate to the conductive structure and a porous/less dense region proximate to an overlying dielectric layer, in accordance with an embodiment of the present disclosure.

FIG. 2 illustrates a cross-sectional view of an example embodiment of the present disclosure. This view is taken perpendicular to a plane of a dielectric layer 200. As shown, conductive structures 204 are on a dielectric layer 200 of a microelectronic package substrate. A surface of the conductive structures 204 has low surface roughness (e.g., less than 50 nm average root mean squared feature size when measured using an atomic force microscope (AFM)). As described above, this low surface roughness reduces resistive loss for signals transmitted, in part, at a surface of a conductive structure 204. This can improve the integrity of signals transmitted through the line 204 (as illustrated in FIG. 1C).

An adhesion layer 208 (in some examples comprising silicon and nitrogen ($SiN_x$)) and in other examples comprising any of the preceding examples) is over (and in some cases, directly on) the conductive structures 204. The adhesion layer 208 includes a dense region 212 that has a density at or approaching a density of a continuous thin film of the material (e.g., a continuous thin film of a nitride, carbide, oxide, oxynitride, oxycarbide of silicon, titanium, or tantalum). The dense region 212 is proximate to, and in some cases in direct contact with, the smooth surface of the line 204. At the surface of the layer 208 is a less dense surface region 216 that includes nanometer-scale pores. This porosity can provide structures into which a second dielectric layer 220 can penetrate, thereby becoming mechanically anchored at spots within the less dense portion 216 of the adhesion layer 208, thus improving adhesion between the adhesion layer 208 and the second dielectric layer 220. In this way, a low insertion loss conductive structure 204 is formed that still adheres to the dielectric layer 220.

Architecture and Methodology

FIGS. 3A-3F illustrate various stages of fabrication of some embodiments of the present disclosure. The transverse cross-sectional views presented in FIGS. 3A-3F are taken perpendicular to a longitudinal axis of a trace.

Figure 3A:
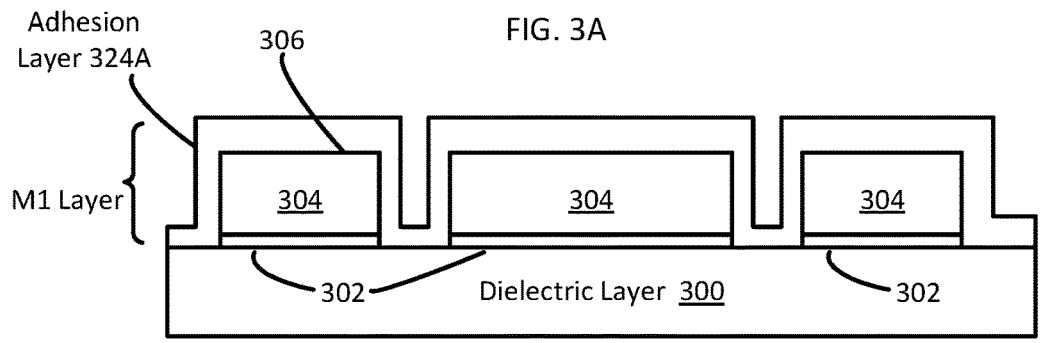
FIGS. 3A-3F are cross-sectional views of a microelectronic package substrate (taken perpendicular to a plane of the substrate) at various stages of fabrication, wherein the microelectronic package substrate includes conductive structures, and wherein some of the conductive traces are covered on one or more sides with an adhesion layer having a dense region and a porous/less dense region in accordance with an embodiment of the present disclosure.

FIG. 3A illustrates formation of a first layer of conductive structures ("M1") on a dielectric layer 300 of a microelectronic package substrate. Examples of the dielectric layer 300 can include one or more layers of an organic resin, such as an epoxy or other polymerizable resin (e.g., network polymer components, thermosetting polymer components, thermoplastic polymer components). Other materials can be added to the organic resin to promote hardening such as polymerization reaction initiators or hardeners. In some cases, filler materials can be added to the resin prior to hardening to alter the mechanical and/or electrical properties of the dielectric layer 300. Example materials include micron sized and/or nano-sized $SiO_2$ particles, among others. In one example, the dielectric layer is formed from ABF or Ajinomoto build-up film. In some cases, a seed layer 302 can be formed on an exposed surface of the dielectric layer 300. The seed layer 302 can be formed by electroless deposition techniques or physical vapor deposition (i.e., sputtering). The conductive seed layer 302, by providing a conductive base on the dielectric layer 300, can enable electrolytic formation of conductive structures on the portions of the seed layer 302.

Conductive structures 304 in the M1 layer can be formed on the dielectric layer 300 by, for example, first forming the seed layer 302 and then forming over the seed layer 302 a photolithographic film to the dielectric layer 300. Applying the photolithographic film can include lamination of a dry photoresist film on the seed layer 302. Trenches can be patterned in the dielectric layer 300 using a sequence of photolithographic exposure and development techniques. These trenches can expose portions of the seed layer 302. The conductive structures 304 themselves can then be formed in the trenches and on the exposed portions of the seed layer 302 using electrolytic deposition techniques.

Portions of the seed layer 302 not used in the electrolytic formation of the conductive structures 304 can be exposed upon removal of the photolithographic layer and then removed by etching after formation of the conductive structures 304. This removes portions of the seed layer 302 that would otherwise electrically connect (and thus short) conductive structures 304.

As is also shown in FIG. 3A, an adhesion layer 324A can then formed over (and in some cases, on) the smooth surface 306 of the conductive structures 304. As indicated above, the surface 306 of the conductive structures is preserved in its as-formed state by the adhesion layer 324A. In some examples, the surface roughness of the surface 306 is less than 50 nm, less than 75 nm, or less than 100 nm (as indicated by average RMS features size, measured by AFM). As is apparent upon the description herein, the adhesion layer 324A can protect the underlying conductive structures 304 from developing a surface roughness (e.g., greater than 50 nm) that can increase insertion loss.

The adhesion layer 324A can be formed using techniques that include physical vapor deposition (sputtering), chemical vapor deposition, atomic layer deposition, among others. In some examples, a thickness of the adhesion layer 324A (measured in FIG. 3A from a surface 306 of the conductive structures 304 to an exposed surface of adhesion layer 324A) can be within any of the following ranges: less than 500 nm; from 100 nm to 400 nm; from 250 nm to 400 nm; from 250 nm to 300 nm; from 100 nm to 300 nm.

In some cases, prior to formation of the adhesion layer 324A, adhesion between the conductive structure 304 (often formed from copper or a copper alloy) and the adhesion layer 324A can be improved by treating the surface of the conductive structure 304. Examples of surface treatments include, but are not limited to, exposure of the exposed surfaces of the conductive structures 304 to ammonia and/or silane (which can be provided in argon) before formation of the adhesion layer 324A.

Figure 3B:
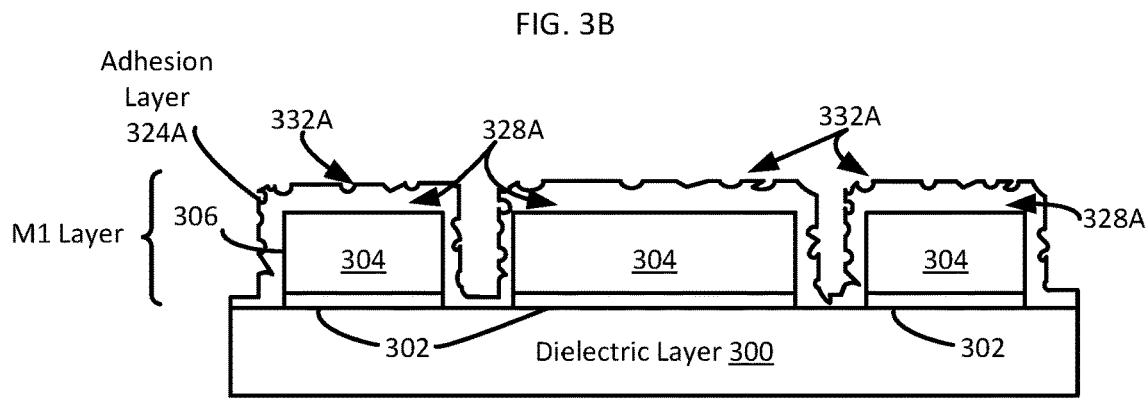

Turning to FIG. 3B, an exposed surface of the adhesion layer 324A can be processed so as to be porous and/or less dense. This can improve adhesion between the adhesion layer 324A and a subsequently applied dielectric layer. As shown in FIG. 3B, the adhesion layer 324A is processed so as to include a first portion 328A that remains in its continuous, dense, and as-deposited form. The adhesion layer 324A further includes a second portion 332A that, as a result of the processing, can become less dense and/or more porous. The first portion 328A and the second portion 332A thus provide an adhesion layer 324A that decreases in density as a function of increasing distance from a surface 306 of the conductive structure 304 that is in contact with the adhesion layer 324A. In some cases, this configuration can be referred to as a "graded" adhesion layer 324A. In some examples, a thickness of the first portion 328A can be within any of the following ranges: from 100 nm to 400 nm; from 150 nm to 400 nm; from 150 nm to 300 nm; from 150 nm to 250 nm. In some examples, a thickness of the second portion 332A can be within any of the following ranges: from 10 nm to 100 nm; from 10 nm to 50 nm; from 25 nm to 100 nm; from 25 nm to 50 nm. In some examples, the second portion 332A can have a porosity of from 5% to 25% (i.e., a density that is from 5% to 25%) less than the first portion 328A. Porosity can be measured using refractive index or depth profiling techniques. It will be appreciated that the depiction of the surface of the adhesion layer 324A the FIG. 3B (and others) is for illustration purposes only and that the nanometer scale porosity is most likely to be detected using refractive index or depth profiling measurements.

In the example shown in FIG. 3B, the first portion 328A can be over (and optionally in direct contact with) three surfaces (top and two opposing sides) of a conductive structure 304 having an approximately rectangular plan view profile (e.g., left-most and right-most structures 304). In an alternative example, the first portion 328A can be over (and optionally in direct contact with) two surfaces (top and a circumferential side) of a via having an approximately circular plan view profile (e.g., the center structure 304). In some examples the first portion 328A is a region between the conductive structure 304 and the second portion 332A.

As indicated above, the first portion 328A has a density approaching that of a continuous adhesion film. This dense structure can provide good hermeticity, thus preventing diffusion of oxygen, water ambient water vapor, or other atmospheric contaminants that can degrade adhesion between the conductive structures 304 and a surrounding dielectric material (described below) from reaching the conductive structure 304.

The second portion 332A is over the first portion 328A and has a lower density than that of the first portion 328A. As indicated above, the density of the adhesion layer 324A can decrease the further from the surface of a conductive structure 306 and the closer the layer 324A is to a surface of an overlying dielectric layer, in some embodiments. As also indicated above, the less dense/porous second portion 332A that is closer to the overlying dielectric layer can provide pores/features for mechanical interconnection with the overlying dielectric, thus improving adhesion between the adhesion layer 324A and the overlying dielectric layer.

A graded adhesion layer 324A can be formed using, in one example, dual-mode plasma enhanced chemical vapor deposition (PECVD). In this case, the plasma can be generated using at least two radiation sources. In one example, the excitation radiation sources include radio frequency (RF) and microwave radiation. During deposition of the adhesion layer 324A, the first portion 328A can be formed by using relatively more microwave energy than RF energy to form the plasma. This combination can form the denser portion 328A. As the adhesion layer 324A grows, the relative mix of excitation energy reverses, with relatively more RF energy than microwave energy being used to form the plasma. This combination lends itself to formation of the less dense/more porous second portion 332A.

Figure 3C:
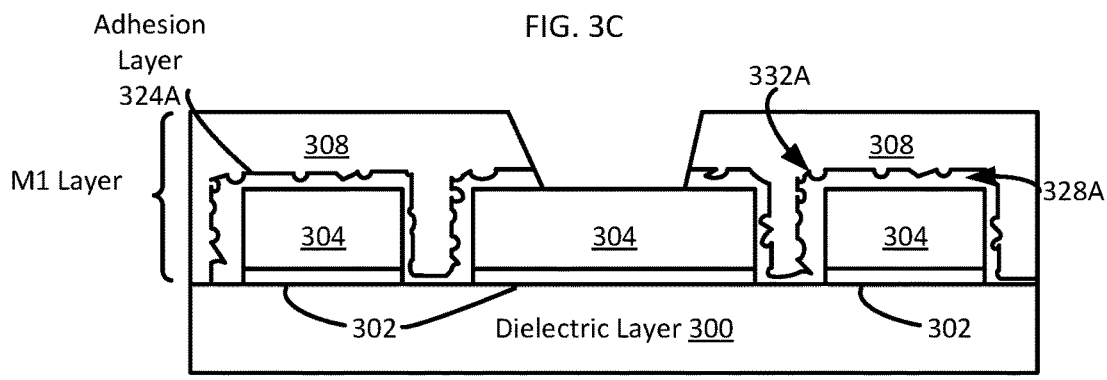

Turing now to FIG. 3C, a second dielectric layer 308 can be formed over (and in some cases on) the graded adhesion layer 324A over the conductive structures 304. The second dielectric layer 308 can be composed of materials the same or similar to the dielectric layer 300. This second dielectric layer 308 can be patterned to expose one or more of the conductive structures 304, as shown in FIG. 3C. This patterning can be accomplished photolithographically (e.g., to form traces) or by laser drilling (e.g., to form a hole in which to form a via). In some cases, depending on the patterning technique and/or laser used, a subsequent process can be applied to remove residue and/or remove the adhesion layer 324A exposed by the patterning and/or laser drilling. For example, a $CO_2$ laser can be followed by a $CF_4$ reactive ion etch to remove residue and the exposed portion of the adhesion layer 324A. A UV laser will remove the adhesion layer and thus a process to remove laser ablation residue can be used. In any of these cases, a wet etch may be used to either remove an exposed portion of the adhesion layer 324A and/or remove patterning/laser drilling debris.

Figure 3D:
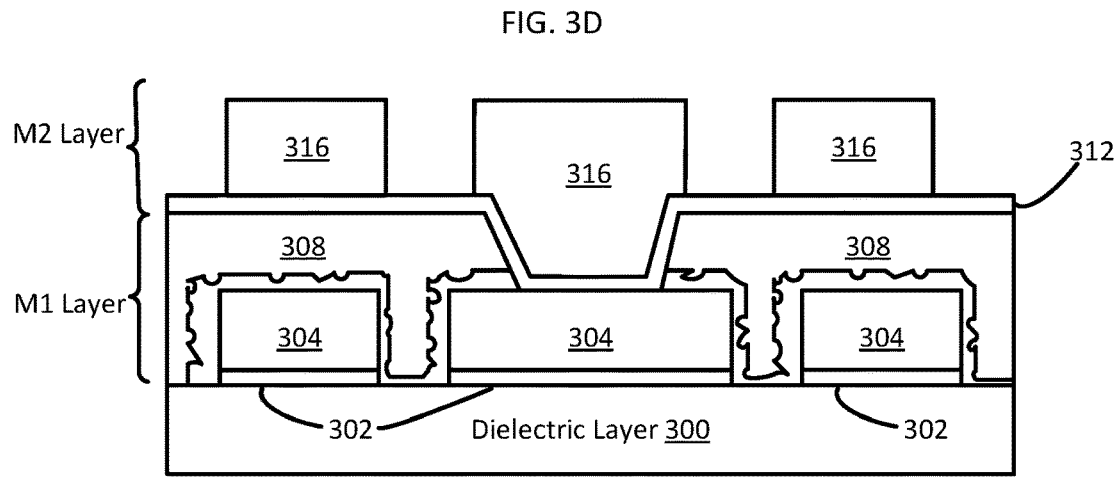

The exposed portion of the conductive structure 304 shown in FIG. 3C can then be used to establish electrical connection with an overlying conductive structure. This is illustrated in FIG. 3D in which a second layer (M2) of conductive structures 316 is formed on a seed layer 312 (e.g., a titanium and copper alloy). The formation of the seed layer 312 and conductive structures 316 can be accomplished using techniques described above for analogous layers in M1.

Figure 3E:
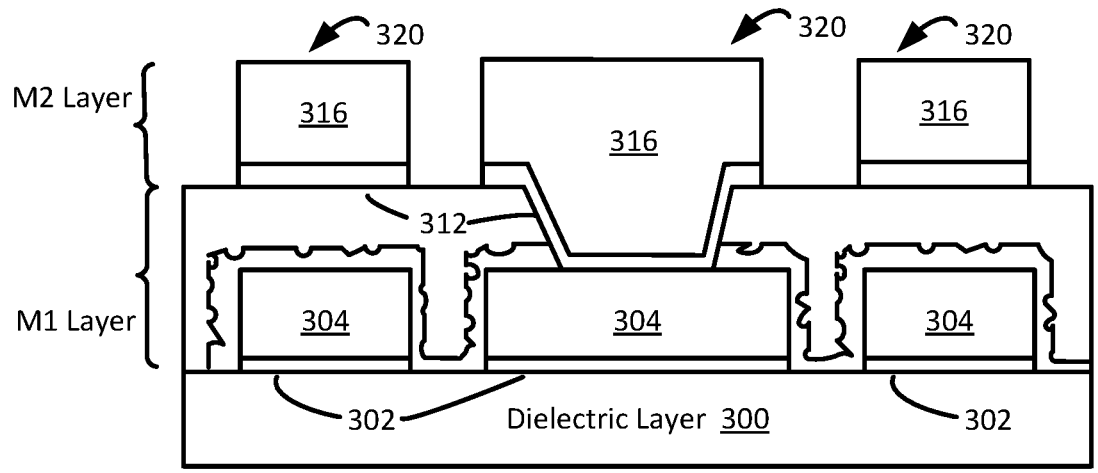

FIG. 3E illustrates the selective removal of portions of the seed layer 312, as described above in the context of seed layer 302.

Figure 3F:
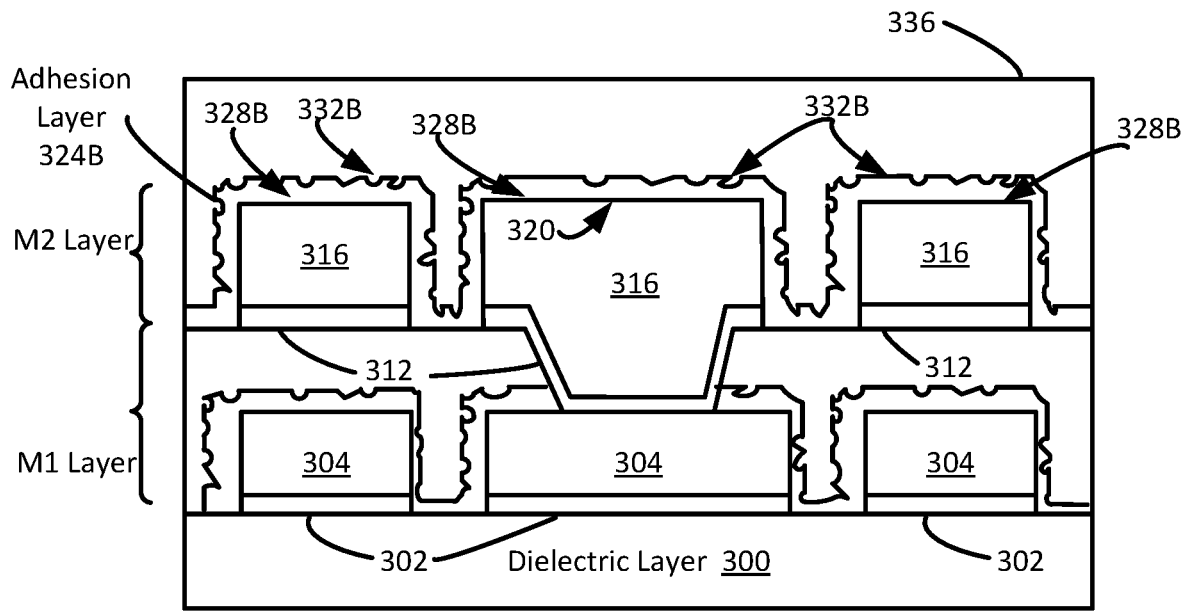

FIG. 3F illustrates formation of an adhesion layer 324B formed over (and in some cases, on) the smooth surface 320 of the conductive structures 316. As described above, the adhesion layer 324B can protect the underlying conductive structures 316 from developing surface roughness (e.g., greater than 50 nm) that can impact insertion loss. Furthermore, analogous to the description of adhesion layer 324A, a portion of the adhesion layer 324B can be processed so as to have a less dense surface. This can provide improved adhesion with a subsequently applied dielectric layer. A first portion 328B of the adhesion layer 324B remains in its continuous, dense, and as-deposited form. A second portion 332B can processed to become less dense/more porous, analogous to the description provided above. Third dielectric layer 336 can then be formed over the M2 layers, wherein the less dense/porous second portion 332B of the adhesion layer 324B can become mechanically attached to the porous/less dense second portion 332B.

The preceding processes can be repeated any number of times to produce a multi-layered microelectronic package substrate.

Figure 3G:
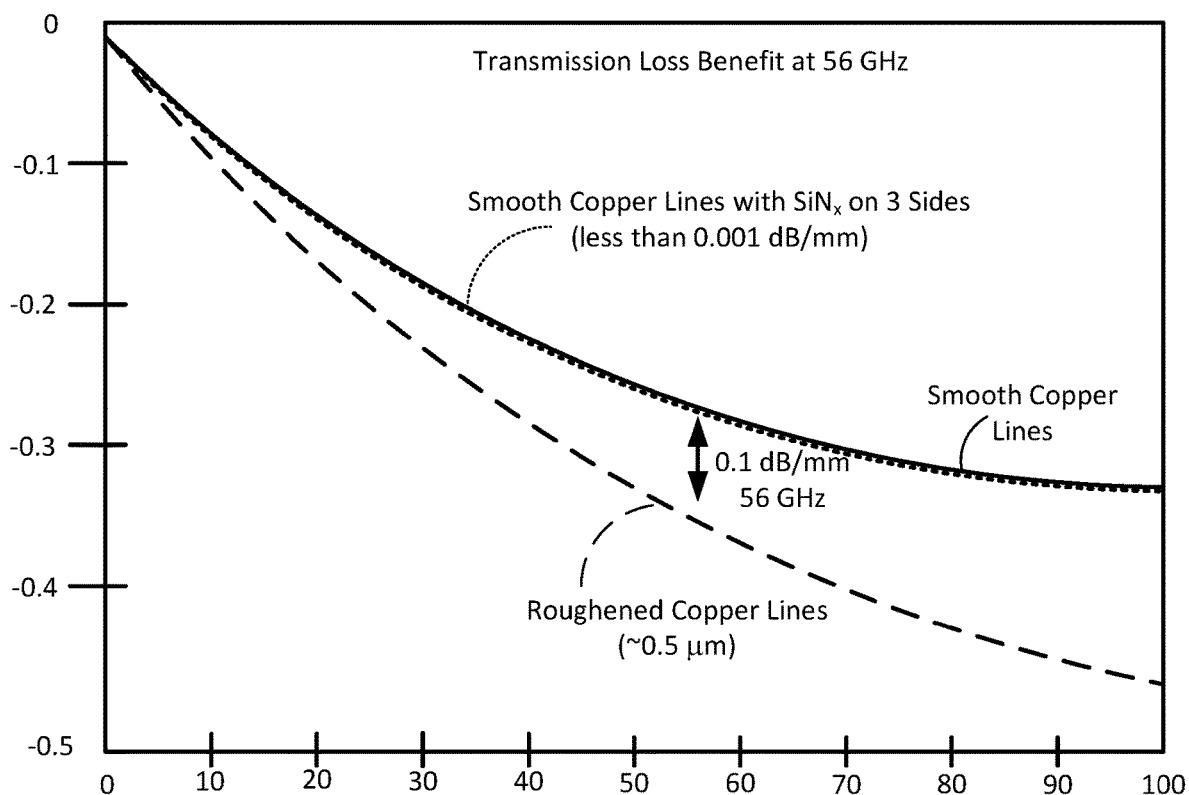
FIG. 3G are simulated insertion losses over a range of frequencies of (1) a signal transmitted through a copper trace having a smooth surface, (2) a signal transmitted through a copper trace having a smooth surface and that is covered on three sides with a layer of $SiN_x$, both of which are compared to insertion loss of (3) a signal transmitted through a copper trace having a roughened surface, in accordance with an embodiment of the present disclosure.

FIG. 3G illustrates the results of a simulation similar to those presented in FIG. 1C, except that the simulation also includes insertion loss of a smooth surfaced trace (e.g., surface topography less than 50 nm) covered on three sides with a adhesion layer, as shown in FIG. 3G and described above. As in FIG. 1C, the results shown in FIG. 3G include insertion loss at 25° C. over a range of signal frequencies for smooth (e.g., surface roughness of ~50 nm) copper lines and roughened copper lines (e.g., surface roughness of ~500 nm). Also similar to FIG. 1C, the signal difference between smooth copper lines and roughened copper lines at 56 GHz is 0.1 decibel (dB). As can be seen, the performance of smooth copper lines surrounded by dielectric compared to smooth copper lines coated on three sides with an adhesion layer are nearly indistinguishable (a difference of at most 0.001 dB/mm at all simulated frequencies).

Example System

Figure 4:
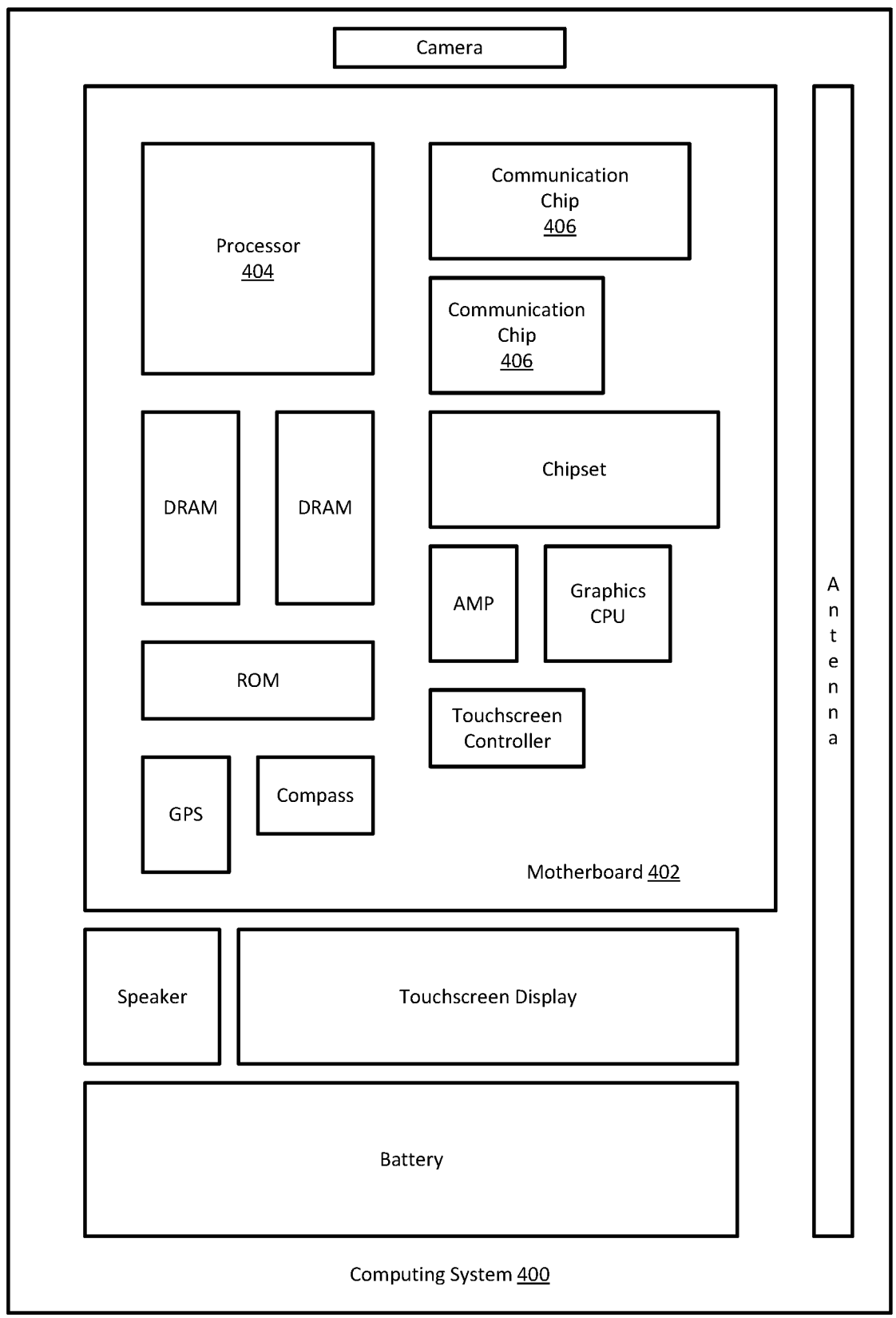
FIG. 4 illustrates a computing system including one or more of the integrated circuit structures formed on a substrate, as variously described herein, in accordance with an embodiment of the present disclosure.

FIG. 4 is an example computing system implemented with one or more of the integrated circuit structures as disclosed herein, in accordance with some embodiments of the present disclosure. As can be seen, the computing system 400 houses a motherboard 402. The motherboard 402 may include a number of components, including, but not limited to, a processor 404 and at least one communication chip 406, each of which can be physically and electrically coupled to the motherboard 402, or otherwise integrated therein. As will be appreciated, the motherboard 402 may be, for example, any printed circuit board, whether a main board, a daughterboard mounted on a main board, or the only board of system 400, etc.

Depending on its applications, computing system 400 may include one or more other components that may or may not be physically and electrically coupled to the motherboard 402. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 400 may include one or more integrated circuit structures or devices configured in accordance with an example embodiment (e.g., a module including an integrated circuit device on a substrate, the substrate including conductive structures covered on at least one side by an adhesion layer that includes a dense region and a porous region, as variously provided herein). In some embodiments, multiple functions can be integrated into one or more chips (e.g., for instance, note that the communication chip 406 can be part of or otherwise integrated into the processor 404).

The communication chip 406 enables wireless communications for the transfer of data to and from the computing system 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others. In some embodiments, communication chip 406 may include one or more transistor structures having a gate stack an access region polarization layer as variously described herein.

The processor 404 of the computing system 400 includes an integrated circuit die packaged within the processor 404. In some embodiments, the integrated circuit die of the processor includes onboard circuitry that is implemented with one or more integrated circuit structures or devices as variously described herein. The term "processor" may refer to any device or portion of a device that processes, for instance, electronic data from registers and/or memory to transform that electronic data into other electronic data that may be stored in registers and/or memory.

The communication chip 406 also may include an integrated circuit die packaged within the communication chip 406. In accordance with some such example embodiments, the integrated circuit die of the communication chip includes one or more integrated circuit structures or devices as variously described herein. As will be appreciated in light of this disclosure, note that multi-standard wireless capability may be integrated directly into the processor 404 (e.g., where functionality of any chips 406 is integrated into processor 404, rather than having separate communication chips). Further note that processor 404 may be a chip set having such wireless capability. In short, any number of processor 404 and/or communication chips 406 can be used. Likewise, any one chip or chip set can have multiple functions integrated therein.

In various implementations, the computing system 400 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

FURTHER EXAMPLE EMBODIMENTS

The following examples pertain to further embodiments, from which numerous permutations and configurations will be apparent.

Example 1 is an integrated circuit package comprising: a first layer comprising a dielectric material; a structure comprising a conductive material over and/or within the first layer, the structure having at least one surface; and a second layer over the at least one surface of the structure, the second layer compositionally distinct from the first layer, wherein a first portion of the second layer is proximate to the structure and has a first density, and a second portion of the second layer is over the first portion and has a second density less than the first density.

Example 2 includes the subject matter of Example 1, wherein the surface of the structure has a surface roughness of 50 nm or less.

Example 3 includes the subject matter of Example 1 or 2, wherein the second portion of the second layer has density that is from 10% to 25% less dense that the first portion.

Example 4 includes the subject matter of any of the preceding Examples, wherein the second layer has a thickness of from 150 nm to 300 nm.

Example 5 includes the subject matter of any of the preceding Examples, wherein: the first portion has a first thickness of from 150 nm to 250 nm as measured from an adjacent surface of the structure to the second portion; and the second portion has a second thickness of from 10 nm to 50 nm as measured from an adjacent surface of an overlying fourth layer to the first portion.

Example 6 includes the subject matter of any of the preceding Examples, further comprising a fourth layer comprising the dielectric material over the first layer and the second layer, the fourth layer being compositionally distinct from the second layer.

Example 7 includes the subject matter of any of the preceding Examples, wherein the structure comprises a copper or copper alloy transmission line.

Example 8 includes the subject matter of Example 7, wherein the second layer is on a top surface and at least two side surfaces of the transmission line.

Example 9 includes the subject matter of any of Examples 1-6, wherein the structure is a copper or copper alloy via.

Example 10 includes the subject matter of Example 9, wherein the second layer is on a top surface and a circular peripheral surface of the via.

Example 11 includes the subject matter of any of the preceding Examples, wherein the second layer comprises silicon and nitrogen.

Example 12 includes the subject matter of any of the preceding Examples, wherein the second layer comprises silicon and one or more of carbon, oxygen, and nitrogen.

Example 13 includes the subject matter of any of Examples 1-10, wherein the second layer comprises one of titanium and tantalum and one or more of carbon, oxygen, and nitrogen.

Example 14 is a printed circuit board that includes the subject matter of any of the preceding Examples.

Example 15 is a computing system that includes the subject matter of any of the preceding Examples.

Example 16 is an integrated circuit package substrate comprising: a first layer comprising a dielectric material; a structure over and/or within the first layer having at least one surface; and a second layer over the at least one surface of the structure, the second layer compositionally distinct from the first layer, wherein a first portion of the second layer is proximate to the structure and has a first density, and a second portion of the second layer is over the first portion and has a second density from 10% to 25% less than the first density.

Example 17 includes the subject matter of Example 16, wherein the second layer comprises silicon and nitrogen.

Example 18 includes the subject matter of either of Examples 16 or 17, wherein the second layer comprises silicon and one or more of carbon, oxygen, and nitrogen.

Example 19 includes the subject matter of any of Examples 16-18, wherein the second layer comprises one of titanium and tantalum and one or more of nitrogen, oxygen, and carbon.

Example 20 includes the subject matter of any of Examples 16-19, wherein the structure comprises a copper alloy.

Example 21 includes the subject matter of any of Examples 16-20, wherein the structure comprises a copper or copper alloy transmission line.

Example 22 includes the subject matter of any of Examples 16-20, wherein the structure comprises a copper or copper alloy via.

Example 23 includes the subject matter of any of Examples 16-22, wherein the surface of the structure has a surface roughness of 50 nm or less.

Example 24 includes the subject matter of any of Examples 16-21 and 23, wherein the second layer is on a top surface and at least two side surfaces of the structure.

Example 25 is a printed circuit board comprising the integrated circuit package substrate of any of Examples 16-24.

Example 26 is a computing system comprising the integrated circuit package substrate of any of Examples 16-25.

Example 27 is an integrated circuit package comprising: a first layer comprising a dielectric material; a structure comprising a conductive material over and/or within the first layer, the structure having at least one surface with a surface roughness of 50 nm or less; and a second layer over the at least one surface of the structure, the second layer compositionally distinct from the first layer, wherein a first portion of the second layer is proximate to the structure and has a first density, and a second portion of the second layer is over the first portion and has a second density less than the first density.

Example 28 includes the subject matter of Example 27, wherein the second layer is on a top surface and at least two side surfaces of the structure, and wherein the structure is a copper or copper alloy transmission line.

Example 29 includes the subject matter of either of Examples 27 or 28, wherein the second layer has a thickness of from 150 nm to 300 nm.

Example 30 includes the subject matter of any of Examples 27-29, wherein the second layer comprises silicon and nitrogen.

Example 31 includes the subject matter of any of Examples 27-30, wherein the second layer comprises silicon and one or more of carbon, oxygen, and nitrogen.

Example 32 includes the subject matter of any of Examples 27-31, wherein the second layer comprises one of titanium and tantalum and one or more of nitrogen, oxygen, and carbon.

Example 33 is a printed circuit board comprising the integrated circuit package of any of Examples 27-32.

Example 34 is a computing system comprising the integrated circuit package of any of Examples 27-33.

What is claimed is:

1. An integrated circuit package comprising:
a first layer comprising a dielectric material;
a structure comprising a conductive material over and/or within the first layer, the structure having at least one surface; and
a second layer over the at least one surface of the structure, the second layer compositionally distinct from the first layer,
wherein a first portion of the second layer is proximate to the structure and has a first density, and a second portion of the second layer is over the first portion and has a second density less than the first density.

2. The integrated circuit package of claim 1, wherein the surface of the structure has a surface roughness of 50 nm or less.

3. The integrated circuit package of claim 1, wherein the second portion of the second layer has density that is from 10% to 25% less dense that the first portion.

4. The integrated circuit package of claim 1, wherein:
the first portion has a first thickness of from 150 nm to 250 nm as measured from an adjacent surface of the structure to the second portion; and
the second portion has a second thickness of from 10 nm to 50 nm as measured from an adjacent surface of an overlying fourth layer to the first portion.

5. The integrated circuit package of claim 1, wherein the structure comprises a copper or copper alloy transmission line.

6. The integrated circuit package of claim 1, wherein the second layer comprises silicon and one or more of carbon, oxygen, and nitrogen.

7. The integrated circuit package of claim 1, wherein the second layer comprises one of titanium and tantalum and one or more of carbon, oxygen, and nitrogen.

8. A printed circuit board comprising the integrated circuit package of claim 1.

9. A computing system comprising the integrated circuit package of claim 1.

10. An integrated circuit package substrate comprising:
a first layer comprising a dielectric material;
a structure over and/or within the first layer having at least one surface; and
a second layer over the at least one surface of the structure, the second layer compositionally distinct from the first layer,
wherein a first portion of the second layer is proximate to the structure and has a first density, and a second portion of the second layer is over the first portion and has a second density from 10% to 25% less than the first density.

11. The integrated circuit package substrate of claim 10, wherein the second layer comprises silicon and nitrogen.

12. The integrated circuit package substrate of claim 10, wherein the second layer comprises one of titanium and tantalum and one or more of nitrogen, oxygen, and carbon.

13. The integrated circuit package substrate of claim 10, wherein the structure comprises a copper or copper alloy transmission line.

14. The integrated circuit package substrate of claim 10, wherein the structure comprises a copper or copper alloy via.

15. The integrated circuit package substrate of claim 10, wherein the surface of the structure has a surface roughness of 50 nm or less.

16. An integrated circuit package comprising:
a first layer comprising a dielectric material;
a structure comprising a conductive material over and/or within the first layer, the structure having at least one surface with a surface roughness of 50 nm or less; and
a second layer over the at least one surface of the structure, the second layer compositionally distinct from the first layer,
wherein a first portion of the second layer is proximate to the structure and has a first density, and a second portion of the second layer is over the first portion and has a second density less than the first density.

17. The integrated circuit package of claim 16, wherein the second layer is on a top surface and at least two side surfaces of the structure, and wherein the structure is a copper or copper alloy transmission line.

18. The integrated circuit package of claim 16, wherein the second layer has a thickness of from 150 nm to 300 nm.

19. The integrated circuit package of claim 16, wherein the second layer comprises silicon and one or more of carbon, oxygen, and nitrogen.

20. The integrated circuit package of claim 16, wherein the second layer comprises one of titanium and tantalum and one or more of nitrogen, oxygen, and carbon.

* * * * *